United States Patent
Ikeda et al.

(10) Patent No.: US 7,154,173 B2
(45) Date of Patent: Dec. 26, 2006

(54) SEMICONDUCTOR DEVICE AND MANUFACTURING METHOD OF THE SAME

(75) Inventors: Osamu Ikeda, Oizumi-machi (JP); Toshiyuki Ohkoda, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/855,972

(22) Filed: May 28, 2004

(65) Prior Publication Data

US 2005/0012169 A1    Jan. 20, 2005

(30) Foreign Application Priority Data

Jun. 6, 2003    (JP) .............................. 2003-161634

(51) Int. Cl.
*H01L 23/10* (2006.01)
*H01L 23/12* (2006.01)

(52) U.S. Cl. .................. 257/704; 257/710; 257/924; 257/723; 257/E23.19; 257/E23.2; 257/E23.21; 257/23.18; 257/E23.193

(58) Field of Classification Search ............... None
See application file for complete search history.

(56) References Cited

U.S. PATENT DOCUMENTS

| | | | | |
|---|---|---|---|---|
| 4,486,622 A | * | 12/1984 | Maselli et al. ................ | 426/17 |
| 5,949,073 A | * | 9/1999 | Shimoyama ............. | 250/338.4 |
| 6,630,725 B1 | * | 10/2003 | Kuo et al. .................. | 257/659 |
| 6,633,079 B1 | * | 10/2003 | Cheever et al. ............. | 257/723 |
| 6,647,778 B1 | * | 11/2003 | Sparks .................... | 73/204.26 |
| 6,809,412 B1 | * | 10/2004 | Tourino et al. ............. | 257/678 |
| 6,852,926 B1 | * | 2/2005 | Ma et al. ................... | 174/52.2 |
| 6,984,421 B1 | | 1/2006 | Pahl et al. | |
| 2002/0113296 A1 | * | 8/2002 | Cho et al. .................. | 257/659 |
| 2003/0042587 A1 | * | 3/2003 | Lee ............................ | 257/678 |
| 2003/0080434 A1 | | 5/2003 | Wataya | |
| 2005/0146632 A1 | | 7/2005 | Wataya | |

FOREIGN PATENT DOCUMENTS

| | | | | |
|---|---|---|---|---|
| CN | 1401136 | | 3/2003 | |
| CN | 1463911 | | 12/2003 | |
| JP | 58-153354 | * | 9/1983 | ................ 257/704 |
| JP | 62-248242 | * | 10/1987 | ................ 257/704 |
| JP | 2-267935 | * | 11/1990 | ................ 438/974 |
| JP | 7-201731 | * | 8/1995 | |
| JP | 11-258055 | | 9/1999 | |
| JP | 11-351959 | | 12/1999 | |
| JP | 2001-013156 | | 1/2001 | |
| JP | 2003-523082 | | 7/2003 | |
| KR | 0128257 | | 8/1998 | |
| KR | 2001-0055249 | | 7/2001 | |
| KR | 2003-0029027 | | 11/2003 | |

* cited by examiner

*Primary Examiner*—Jasmine Clark
(74) *Attorney, Agent, or Firm*—Morrison & Foerster LLP

(57) ABSTRACT

This invention miniaturizes a package of a semiconductor device and simplifies a manufacturing procedure to reduce a manufacturing cost. A semiconductor wafer formed of a plurality of semiconductor chips formed with MEMS devices and wiring thereof on front surface thereof and a cap arrayed wafer disposed with a plurality of sealing caps are attached to seal the MEMS devices in cavities between them. Then, a plurality of via-holes is provided penetrating through the semiconductor wafer to form embedded electrodes therein, and bump electrodes are formed thereon. After this procedure, this structure is cut along scribe lines to be divided into each of packages.

7 Claims, 4 Drawing Sheets

SEMICONDUCTOR DEVICE AND MANUFACTURING METHOD OF THE SAME

CROSS-REFERENCE OF THE INVENTION

This invention is based on Japanese Patent Application No. 2003-161634, the content of which is incorporated herein by reference in its entirety.

BACKGROUND OF THE INVENTION

1. Field of the Invention

The invention relates to a semiconductor device and a manufacturing method thereof, particularly to a semiconductor device in which devices to be sealed are sealed in a package and a manufacturing method thereof.

2. Description of the Related Art

In recent years, a device using a micro electromechanical system (hereafter, referred to as an MEMS device), a charge coupled device (hereafter, referred to as a CCD) used as an image sensor and so on, and a sensor electrically detecting infrared radiation (hereafter, referred to as an IR sensor) are being developed.

These electronic devices or micro-sized mechanical devices (hereafter, referred to as electronic devices) are formed on a semiconductor chip and packaged. Such a package includes a can package in which the electronic devices are sealed with a metal cap and a ceramic package in which the electronic devices are sealed with a ceramic cap.

Relating technologies are disclosed in the Japanese Patent Application Publications Nos. Hei 11-351959, Hei 11-258055 and 2001-13156.

In a conventional package, however, a semiconductor chip formed with devices to be sealed such as electronic devices and a cap for sealing the devices to be sealed are independently prepared and then assembled. This makes a mass-manufacturing procedure complex, and accordingly increases a manufacturing cost. Furthermore, a package size becomes large, resulting in an increase in a mounting area of the package on a printed board.

SUMMARY OF THE INVENTION

The invention provides a semiconductor device and a manufacturing method thereof which simplifies a manufacturing procedure to reduce a manufacturing cost and reduces a package size when electronic devices are packaged.

In a semiconductor device of the invention, a semiconductor chip formed with devices to be sealed on its front surface is attached with a sealing cap, the devices to be sealed being sealed in a cavity formed of a space between the semiconductor chip and the sealing cap. Here, the device to be sealed is an electronic device such as an MEMS device, an IR sensor, and a CCD, or a micro-sized mechanical device.

The semiconductor chip is formed with via-holes penetrating therethrough. These via-holes are formed with embedded electrodes. The embedded electrodes are connected with the devices to be sealed through wiring. The embedded electrodes are connected with electrodes for external connection.

In the invention, a plurality of sealing caps and semiconductor chips of the semiconductor device are formed on wafers, attached to each other, and divided into a plurality of packages. This procedure can simplify a mass-manufacturing procedure, and reduce a manufacturing cost of each of the packages.

Furthermore, via-holes are provided penetrating through the semiconductor chip of each of the packages and embedded electrodes are formed therein, so that bump electrodes can be formed on a bottom of the semiconductor chip. This can miniaturize the package and reduce a mounting area of the package on a printed board.

Furthermore, a cavity for sealing devices to be sealed is filled with an inert gas or kept vacuum so that life and reliability of the sealed devices can be extended and improved.

DETAILED DESCRIPTION OF THE INVENTION

Next, a structure of a semiconductor device of a first embodiment of the invention will be described with reference to drawings.

Figure 1A:
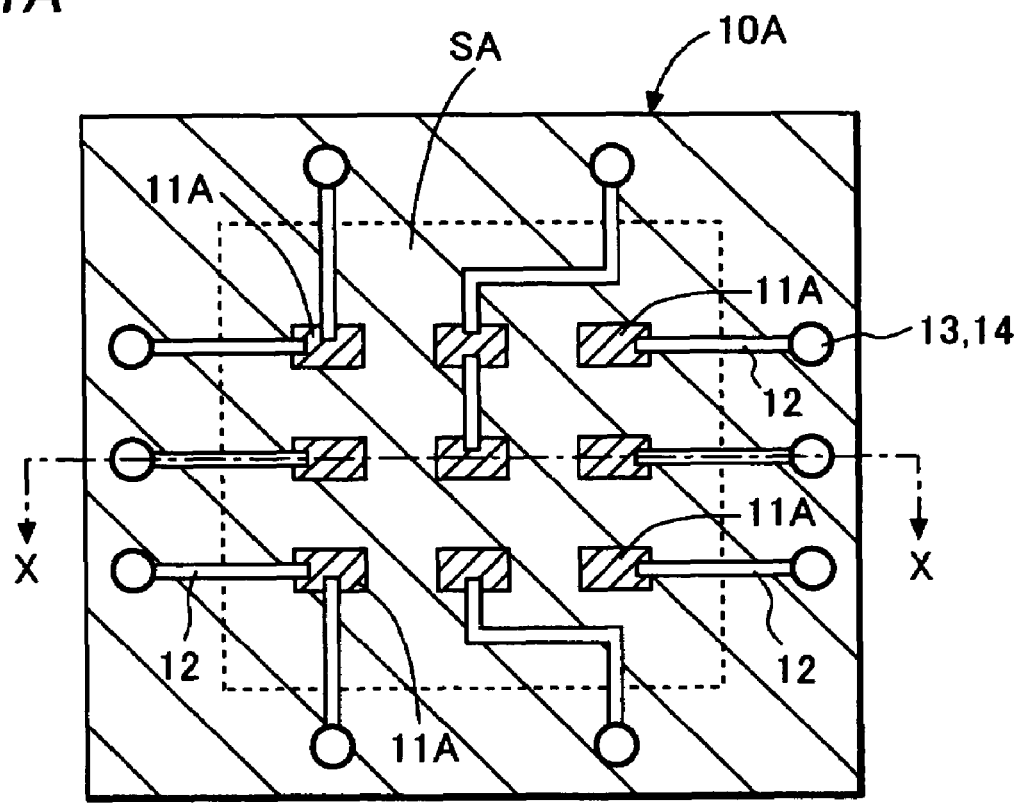
FIG. 1A is a plan view of a semiconductor device of a first embodiment of the invention.
Figure 1B:
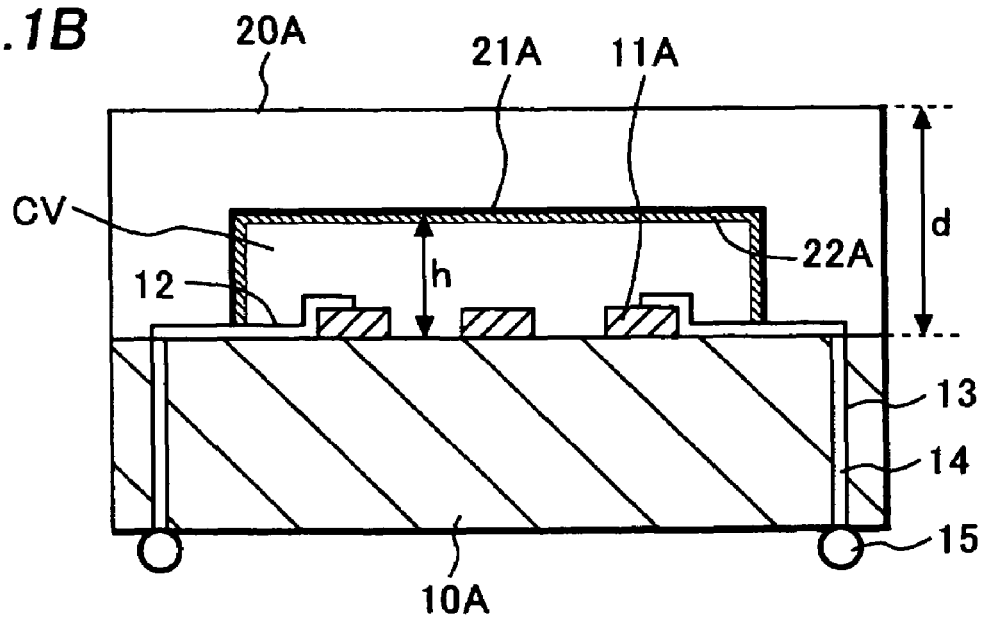
FIG. 1B is a cross-sectional view of line X—X of FIG. 1A.

FIG. 1A is a plan view of a semiconductor device of this embodiment. FIG. 1B is a cross-sectional view along line X—X of FIG. 1A.

A plurality of MEMS devices 11A as devices to be sealed (e.g., a relay, a condenser, a coil or a motor) is formed in a region SA (indicated by a dotted line) on a front surface of a semiconductor chip 10A (e.g., silicon chip). This region SA includes the MEMS devices 11A that function as a single device. That is, these MEMS devices 11A are electronic and mechanical components of a micro-sized mechanism such as a micro-machine.

Wiring 12 (e.g. made of Cu, Al, or Al alloy) connected with these MEMS devices 11A is formed extending to a periphery of the region SA. The wiring 12 is formed in a procedure of forming the MEMS devices 11A on the semiconductor chip 10A, having a thickness of about 1 μm.

A plurality of via-holes 13 is formed right under end portions of the wiring 12 formed extending to the periphery of the region SA, penetrating through the semiconductor chip 10A. Each of these via-holes 13 is formed with an embedded electrode 14 (e.g., made of Cu, Al or Al alloy) therein. The embedded electrodes 14 are formed by a plating method or a sputtering method, and connected with the wiring 12 of the MEMS devices 11A. Although the embedded electrodes 14 are completely embedded in the via holes 13 in FIG. 1B, the embedded electrodes 14 can be partially embedded therein by adjusting a plating time or a sputtering time.

The embedded electrodes 14 are formed with bump electrodes 15 (e.g. made of solder) on a back surface of the semiconductor chip 10A. Accordingly, leads of the packaged semiconductor chip 10A are not necessary to be drawn from sides of the semiconductor chip 10A, but can be drawn from the bottom of the semiconductor chip 10A, thereby realizing miniaturization of the package. This can prevent increasing of a mounting area of the package on a printed board.

The front surface of the semiconductor chip 10A is attached with a sealing cap 20A made of a glass, a silicon, a ceramic or a resin. The semiconductor chip 10A and the sealing cap 20A are attached to each other with an adhesive made of an epoxy resin and the like, with the front surface of the semiconductor chip 10A and a concave portion 21A of the sealing cap 20A (inner surface of the sealing cap 20A) facing each other.

A cavity CV is formed in a space between the front surface of the semiconductor chip 10A and the concave portion 21A of the sealing cap 20A. The MEMS devices 11A are sealed in this cavity CV. The thickness d of the sealing cap 20A is approximately several ten to several hundred μm, the height h of the cavity CV is approximately several to several ten μm, although the embodiment is not limited to these values.

The MEMS devices 11A formed on the front surface of the semiconductor chip 10A are sealed in the cavity CV which is filled with an inert gas (e.g., $N_2$) or kept vacuum. This makes the sealed MEMS devices 11A mechanically protected with the sealing cap 20A, and prevents the MEMS devices 11A from being exposed to air, thereby preventing corrosion or degradation with oxidation thereof. Therefore, life and reliability of the MEMS devices 11A formed on the semiconductor chip 10A can be extended and improved.

When the sealing cap 20A is made of a glass or a silicon, a surface of the concave portion 21A can be formed with a metal thin film 22A having a filter function of blocking or transmitting light having a predetermined wave length. Handling of such a filter made of a metal thin film, which has been difficult to handle with its low strength, can be facilitated by utilizing the cavity CV for forming such a filter 22A on the surface of the concave portion 21A of the sealing cap 20A.

Next, a description will be made on a structure formed with the above described semiconductor chips 10A and sealing caps 20A with reference to drawings.

Figure 2A:
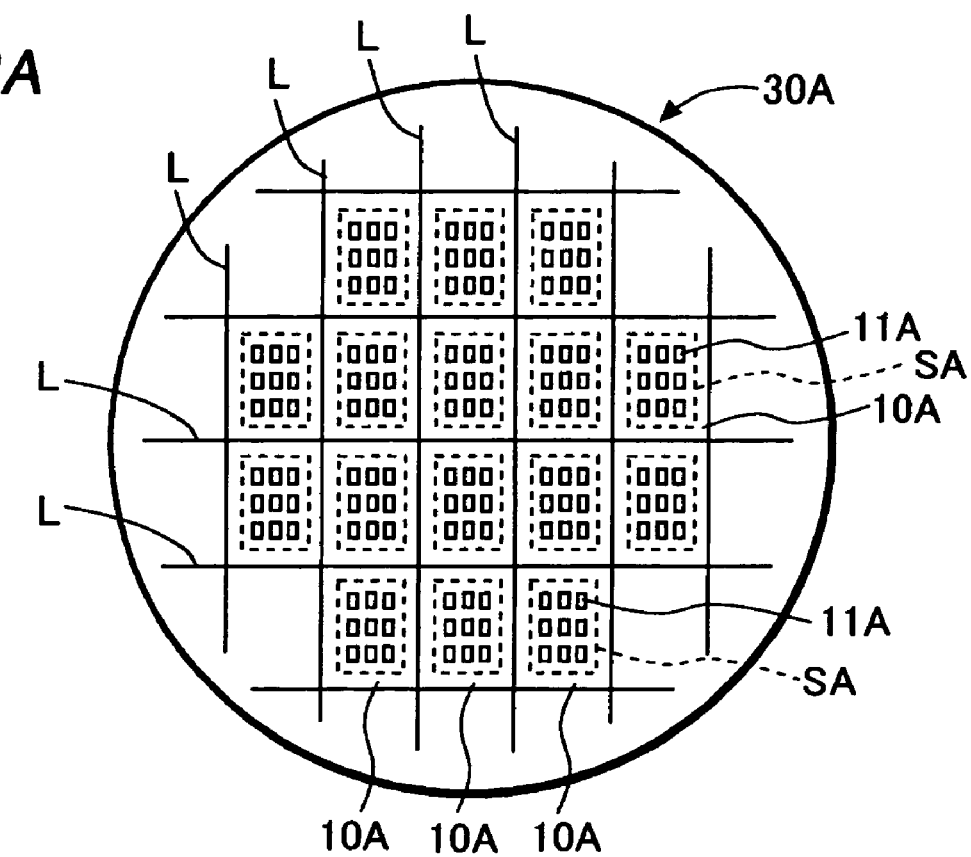
FIGS. 2A and 2B are plan views of a semiconductor wafer and a cap arrayed wafer of the first embodiment of the invention.

FIG. 2A is a plan view of a semiconductor wafer 30A formed of the plurality of the semiconductor chips 10A disposed in a matrix.

The semiconductor wafer 30A is made of a semiconductor material such as silicon. The plurality of the semiconductor chips 10A is partitioned with scribe lines L extending in row and column directions. The MEMS devices 11A are formed in the region SA, in each of the semiconductor chips 10A.

Although not shown, the wiring 12 is connected with each of the MEMS devices 11A, extending to the periphery of the region SA.

Figure 2B:
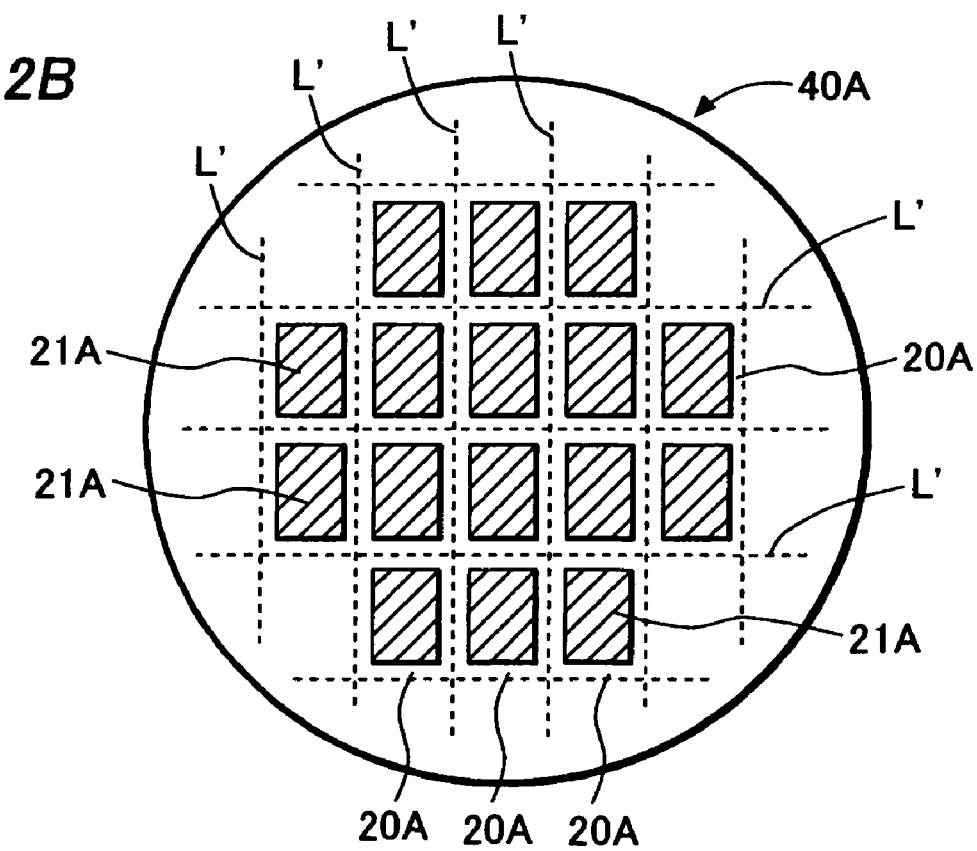

FIG. 2B is a plan view of a cap arrayed wafer 40A formed of the above described sealing caps 20A disposed in a matrix.

The cap arrayed wafer 40A is made of a glass, a silicon, a ceramic or a resin. Each of regions partitioned with scribe lines L' is to face each of the semiconductor chips 10A when attached thereto. These scribe lines L' of the cap arrayed wafer 40A are formed in accordance with the scribe lines L of the semiconductor wafer 30A. The two wafers 30A and 40A are attached so that the scribe lines L' of the cap arrayed wafer 40A are aligned with the scribe lines L of the semiconductor wafer 30A.

Furthermore, the concave portions 21A are formed on the cap arrayed wafer 40A in the regions corresponding to the regions SA of the semiconductor chips 10A. When the cap arrayed wafer 40A is made of a glass, a silicon or a ceramic, the concave portion 21A is formed by etching.

Alternatively, when the cap arrayed wafer 40A is made of a resin, the cap arrayed wafer 40A is formed by injection molding to have the plurality of the concave portions 21A.

Although the embedded electrodes 14 and the bump electrodes 15 serving as electrodes for external connection are connected with the MEMS devices through the wiring 12 in the above described semiconductor chips 10A and the semiconductor wafer 30A, the embedded electrodes 14 and the bump electrodes 15 can be directly connected with the MEMS devices 11A without through the wiring 12. This is applied to a second embodiment described below.

Next, a semiconductor device manufacturing method of this embodiment will be described with reference to drawings.

Figure 3A:
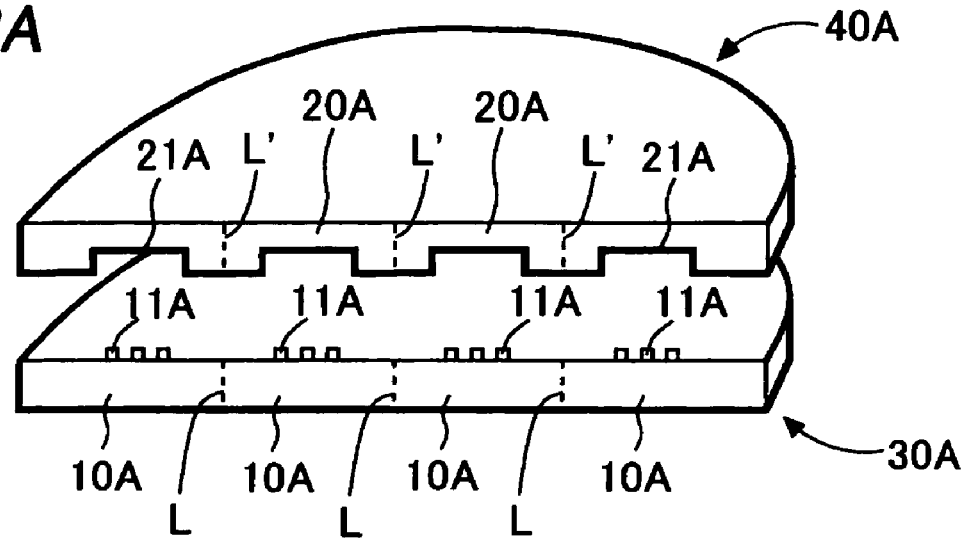
FIGS. 3A, 3B and 3C are cross-sectional views for explaining a manufacturing method of the semiconductor device of the first embodiment of the invention.

As shown in FIG. 3A, the semiconductor wafer 30A formed with the MEMS devices and the wiring 12 (not shown) on its front surface is prepared. The structure of the semiconductor wafer 30A is the same as the structure shown in FIG. 2A.

Then, the cap arrayed wafer 40A having the plurality of the concave portion 21A is prepared. The structure of the cap arrayed wafer 40A is the same as the structure shown in FIG. 2B. When the cap arrayed wafer 40A is made of a glass or a silicon, the surface of the concave portion 21A can be formed with the metal thin film 22A having a filter function of blocking or transmitting light having a predetermined wavelength.

Then, the cap arrayed wafer 40A and the semiconductor wafer 30A are disposed to face the concave portions 21A of the cap arrayed wafer 40A and the front surface of the semiconductor wafer 30A.

Figure 3B:
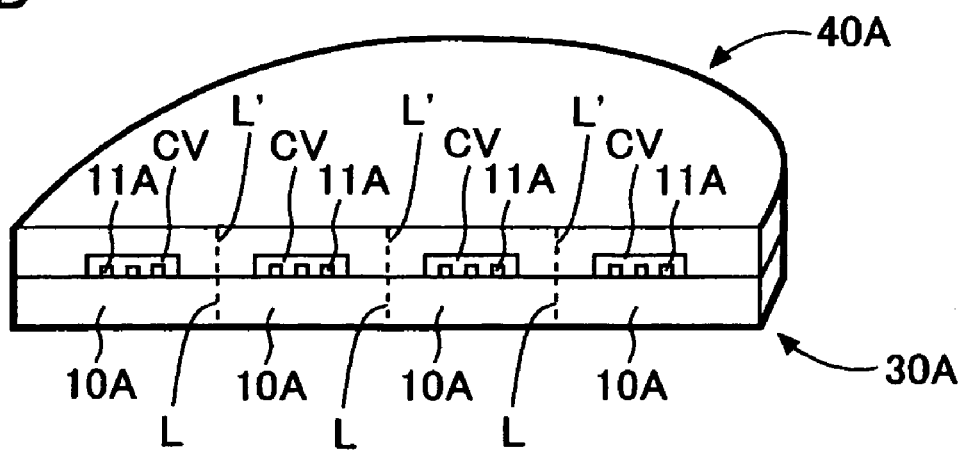

Next, as shown in FIG. 3B, the cap arrayed wafer 40A and the semiconductor wafer 30A are attached with an adhesive made of an epoxy resin or the like. At this time, each of the concave portions 21A of the cap arrayed wafer 40A faces each of the regions SA of the semiconductor wafer 30A.

That is, the cavity CV is formed in a space between each of the concave portions 21A of the cap arrayed wafer 40A and the front surface of the semiconductor wafer 30A, and the MEMS devices 11A are sealed in this cavity. At this time, the cap arrayed wafer 40A and the semiconductor wafer 30A are attached in a vacuum atmosphere to maintain the cavity CV in vacuum. Alternatively, the cap arrayed wafer 40A and the semiconductor wafer 30A can be attached in an inert gas (e.g., $N_2$) atmosphere to fill the cavity CV with the inert gas.

Then, the semiconductor wafer 30A is ground on its back surface to make a thickness of the semiconductor wafer 30A several ten to several hundred μm, for example. Alternatively, this back-grinding can be performed to the cap arrayed wafer 40A or both the semiconductor wafer 30A and the cap arrayed wafer 40A.

Figure 3C:
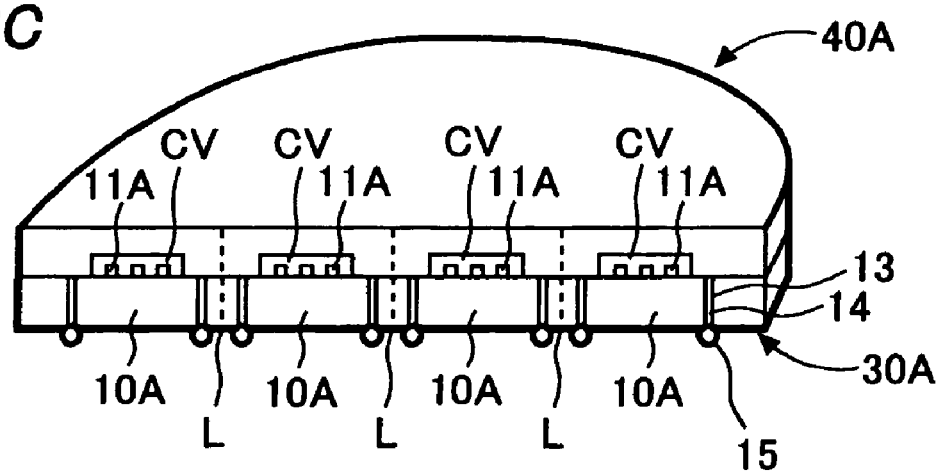

Next, as shown in FIG. 3C, the plurality of the via-holes 13 is formed penetrating from the back surface to the front surface of the semiconductor wafer 30A. An etching method or a laser beam irradiating method can be used for forming these via-holes 13.

The embedded electrodes 14 (e.g., made of Cu, Al or Al alloy) are formed in these via-holes 13 by a plating method or a sputtering method. Furthermore, the embedded electrodes 14 on the back surface of the semiconductor wafer 30 are formed with the bump electrodes 15 (e.g., made of a solder). Although the bump electrodes 15 are formed right under the embedded electrodes 14 in the embodiment shown in FIG. 3C, the bump electrodes 15 can be formed on a back-surface wiring connected with the embedded electrodes 14.

After the above procedure, the attached cap arrayed wafer 40A and semiconductor wafer 30A are cut along the scribe lines L by a dicing blade or laser beams to be divided into each of packages.

As described above, the plurality of the packages is formed from the cap arrayed wafer 40A and the semiconductor wafer 30A simultaneously, thereby simplifying a mass-manufacturing procedure. This reduces a manufacturing cost of each of the packages.

Although the MEMS device 11A is used as a device to be sealed in the above described embodiment, an electronic device of other kind (e.g. IR, sensor) can be used as a device to be sealed.

Next, a structure of a semiconductor device of a second embodiment of the invention will be described with reference to drawings.

Figure 4A:
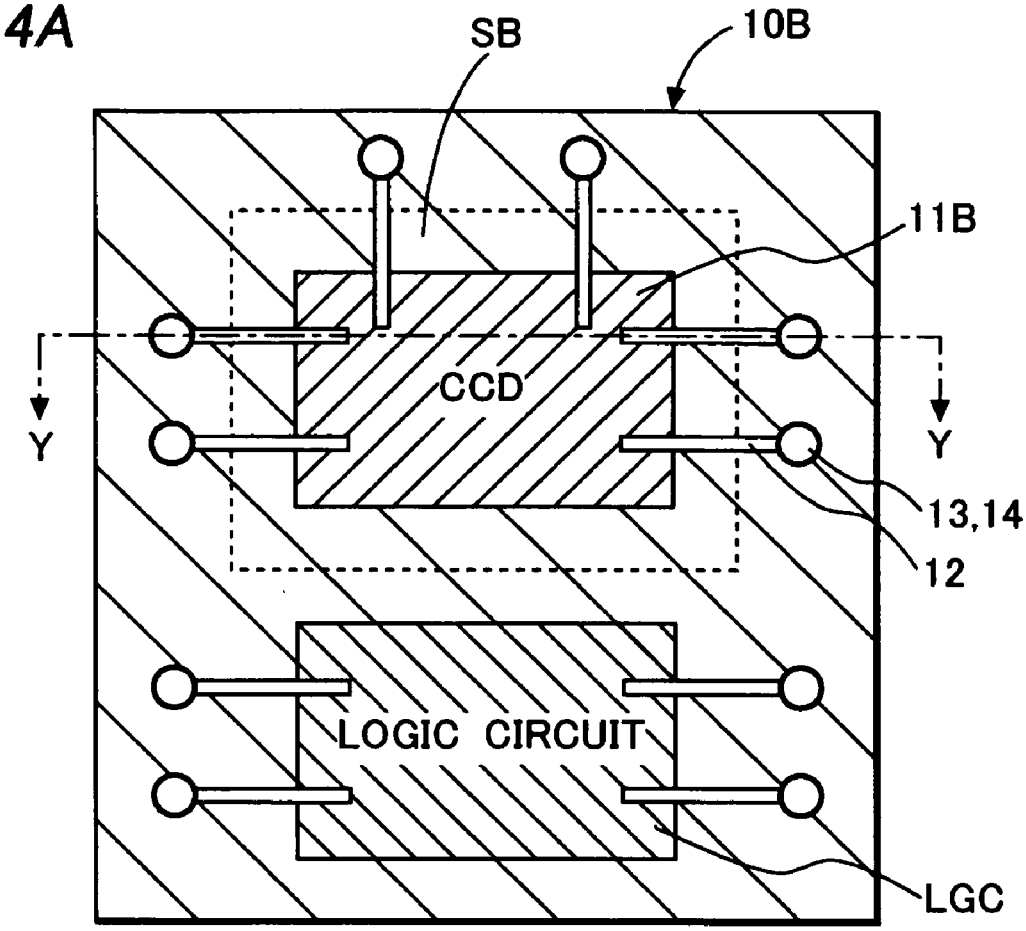
FIG. 4A is a plan view of a semiconductor device of a second embodiment of the invention.
Figure 4B:
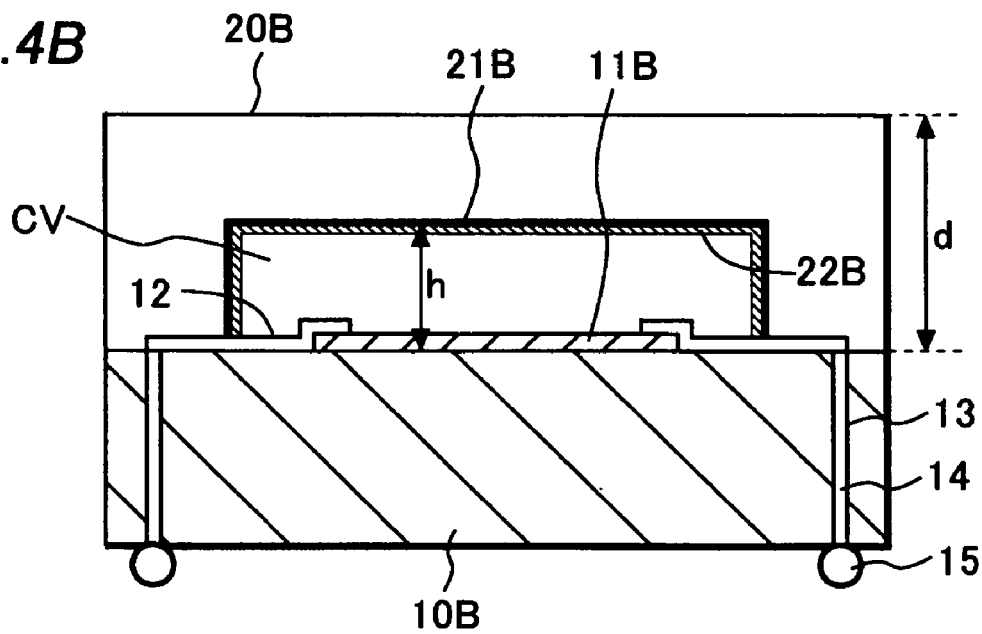
FIG. 4B is a cross-sectional view of line Y—Y of FIG. 4A.

FIG. 4A is a plan view of the semiconductor device of this embodiment. FIG. 4B is a cross-sectional view along line Y—Y of FIG. 4A.

A CCD 11B as a device to be sealed is formed in a region SB (indicated by a dotted line) for formation of a device to be sealed on a front surface of a semiconductor chip 10B. The CCD 11B is used as, for example, an image sensor. A logic circuit LGC for controlling the CCD 11B is formed in other region for formation of a device to be sealed, which is adjacent to the region SB, on the semiconductor chip 10B.

Wiring 12 (e.g., made of Cu, Al or Al alloy) connected with the CCD 11B and its logic circuit LGC is formed extending to a periphery of the region SB and the logic circuit LGC. This wiring 12 is formed in a procedure of forming the CCD 11B and the logic circuit LGC on the semiconductor chip 10B, having a thickness of about 1 μm.

Furthermore, a plurality of via-holes 13 is formed right under end portions of the wiring 12 formed extending to the periphery of the region SB, penetrating through the semiconductor chip 10B. Each of the via-holes 13 is formed with an embedded electrode 14 (e.g., made of Cu, Al or Al alloy). The embedded electrodes 14 are formed by a plating method or a sputtering method, and connected with the wiring 12 of the CCD 11B and the logic circuit LGC.

The embedded electrodes 14 are formed with bump electrodes 15 (e.g., made of solder) on a back surface of the semiconductor chip 10B. Accordingly, leads of the packaged semiconductor chip 10B are not necessary to be drawn from sides of the semiconductor chip 10B, but can be drawn from the bottom of the semiconductor chip 10B, thereby realizing miniaturization of the package. This can prevent increasing of a mounting area of the package on a printed board.

A sealing cap 20B (e.g., made of glass, silicon, or resin) is attached to the front surface of the semiconductor chip 10B. The semiconductor chip 10B and the sealing cap 20B are attached, with the region SB on the front surface of the semiconductor chip 10B and the concave portion 21B of the sealing cap 20B facing each other.

A cavity CV is formed in a space between the region SB on the front surface of the semiconductor chip 10B and the concave portion 21B of the sealing cap 20B. The CCD 11B is sealed in this cavity CV. Here, the CCD 11B formed on the front surface of the semiconductor chip 10B is sealed in the cavity CV which is filled with an inert gas or kept in vacuum. This prevents the CCD 11B from being exposed to air, thereby preventing corrosion or degradation with oxidation thereof. Therefore, life and reliability of the CCD 11B formed on the semiconductor chip 10B can be extended and improved.

On the region formed with the logic circuit LGC, a convex portion (not shown) of the sealing cap 20B is attached without forming the cavity CV.

The CCD 11B is thus sealed in the cavity CV in order to prevent stresses generated by a difference in coefficient of thermal expansion between a material of the sealing cap 20B and a material of the semiconductor chip 10B from affecting the CCD 11B. On the other hand, the logic circuit LGC is thus attached with the convex portion of the sealing cap 20B thereon in order to increase an attachment area of the sealing cap 20B for obtaining high attachment strength.

When the sealing cap 20B is made of a glass or a silicon, a surface of the concave portion 21B can be formed with a metal thin film 22B having a filter function of blocking or transmitting light having a predetermined wave length. Handling of such a filter made of a metal thin film, which has been difficult to handle with its low strength, can be facilitated by utilizing the cavity CV for forming such a filter 22B on the surface of the concave portion 21B of the sealing cap 20B.

Next, a structure formed with the plurality of the semiconductor chips 10B and the sealing caps 20B on wafers will be described with reference to FIGS. 2A and 2B.

The semiconductor chips 10B of this embodiment are partitioned with scribe lines L and disposed in a matrix (not shown), in a similar manner as in the semiconductor wafer 30A shown in FIG. 2A. However, in this embodiment, the CCDs 11B are formed in the region SB (corresponding to approximately a half of the regions SA in FIG. 2A), and the logic circuits LGC (corresponding to approximately another half of the regains SA in FIG. 2A) are formed in positions adjacent the CCDs 11B. The wiring 12 (not shown) is connected with each of the CCDs 11B and the logic circuits LGC, extending to the periphery of the region SB and the region formed with the logic circuit LGC.

The sealing caps 20B of this embodiment are partitioned with scribe lines L' and disposed in a matrix similarly to the cap arrayed wafer 40A shown in FIG. 2B (not shown). However, the concave portions 21B are formed on the cap arrayed wafer 40A only in regions corresponding to the regions SB (not shown) provided for formation of a device to be sealed of the semiconductor chip 10B, in each of the regions partitioned by the scribe lines L'.

The concave portion 21B is formed by etching when the cap arrayed wafer 40A of this embodiment is made of a glass or silicon. Alternatively, the concave portion 21B can be formed simultaneously when the cap arrayed wafer 40A is formed by injection molding if the cap arrayed wafer 40A is made of a resin.

The above described semiconductor wafer and cap arrayed wafer of this embodiment are finally divided in each of the packages through the same procedure of the manufacturing method as that of the first embodiment.

Although the CCD 11B is used as a device to be sealed in the above described embodiment, an electronic device of other kind can be used as a device to be sealed.

What is claimed is:
1. A semiconductor device comprising:
a semiconductor chip comprising a CCD formed on a surface thereof;
a logic circuit controlling the CCD and formed on the surface of the semiconductor chip; and a sealing cap attached to the surface of the semiconductor chip and sealing the CCD in a concave portion formed in the sealing cap, wherein a convex portion of the sealing cap is attached to the logic circuit.

2. A semiconductor device comprising:

a semiconductor chip comprising a CCD formed on a surface thereof; and a sealing cap attached to the surface of the semiconductor chip and sealing the CCD in a concave portion formed in the sealing cap, wherein the device elements are sealed in vacuum.

3. A semiconductor device comprising:

a semiconductor chip comprising a CCD formed on a surface thereof; and a sealing cap attached to the surface of the semiconductor chip and sealing the CCD in a concave portion formed in the sealing cap, the sealing cap being made of an insulator, wherein the device elements are sealed in an inert gas.

4. A semiconductor device comprising:

a semiconductor chip comprising device elements formed on a surface thereof;

a transparent sealing cap attached to the surface of the semiconductor chip and sealing the device elements in a concave portion formed in the sealing cap; and a metal thin film formed on an inner surface of the concave portion so as to provide a filter function of blocking or transmitting light having a predetermined wavelength.

5. A semiconductor device comprising:

a semiconductor chip comprising a CCD formed on a surface thereof;

a sealing cap attached to the surface of the semiconductor chip and sealing the CCD in a concave portion formed in the sealing cap;

an embedded electrode filling a via-hole formed in the semiconductor chip; and a wiring connecting the embedded electrode and at least one of the device elements.

6. A semiconductor device comprising:

a semiconductor chip comprising device elements formed on a surface thereof; and a sealing cap standing on the surface of the semiconductor chip and sealing the device elements in a concave portion formed in the sealing cap, the entire sealing cap being made of a single material and comprising no electric wirings.

7. The semiconductor device of claim 6, wherein the single material is a glass, silicon, a ceramic or a resin.

* * * * *